United States Patent
Kim et al.

(10) Patent No.: US 7,209,508 B2
(45) Date of Patent: Apr. 24, 2007

(54) MULTI-CHANNEL LIGHT SOURCE AND MULTI-CHANNEL OPTICAL MODULE USING THE SAME

(75) Inventors: Seung-Woo Kim, Seoul (KR); Jeong-Seok Lee, Anyang-si (KR); In-Kuk Yun, Suwon-si (KR); Seong-Taek Hwang, Pyeongtaek-si (KR)

(73) Assignee: Samsung Electronics Co., Ltd., Maetan-Dong, Yeongtong-Gu, Suwon-Si, Gyeonegi-Do (KR)

( * ) Notice: Subject to any disclaimer, the term of this patent is extended or adjusted under 35 U.S.C. 154(b) by 189 days.

(21) Appl. No.: 10/852,519

(22) Filed: May 24, 2004

(65) Prior Publication Data

US 2005/0105575 A1    May 19, 2005

(30) Foreign Application Priority Data

Nov. 15, 2003 (KR) ............ 10-2003-0080883

(51) Int. Cl.
*H01S 3/08* (2006.01)
*H01S 3/10* (2006.01)

(52) U.S. Cl. ............... 372/98; 372/20; 372/92

(58) Field of Classification Search .......... 372/20, 372/92, 98
See application file for complete search history.

(56) References Cited

U.S. PATENT DOCUMENTS

| | | | | |
|---|---|---|---|---|
| 5,381,232 A | * | 1/1995 | van Wijk | 356/519 |
| 6,141,360 A | * | 10/2000 | Kinugawa et al. | 372/20 |
| 6,845,121 B2 | * | 1/2005 | McDonald | 372/34 |
| 6,867,868 B1 | * | 3/2005 | Barbarossa | 356/519 |
| 2002/0054614 A1 | * | 5/2002 | Jin | 372/20 |
| 2003/0007540 A1 | * | 1/2003 | Daiber | 372/92 |
| 2003/0173505 A1 | * | 9/2003 | Wipiejewski | 250/226 |
| 2005/0053103 A1 | * | 3/2005 | Lo et al. | 372/20 |

* cited by examiner

*Primary Examiner*—Minsun Oh Harvey
*Assistant Examiner*—Phillip Nguyen
(74) *Attorney, Agent, or Firm*—Cha & Reiter, L.L.C.

(57) ABSTRACT

A multi-channel light source includes a semiconductor optical amplifier for generating light of a wide wavelength band and outputting the generated light through a first end and a second end. The source further includes a Fabry-Perot (FP) resonator for resonating the light inputted from the semiconductor optical amplifier to generate an FP fringe and outputting the FP fringe to the semiconductor optical amplifier. The semiconductor optical amplifier amplifies the FP fringe inputted from the FP resonator and outputs the amplified FP fringe through the first end.

15 Claims, 6 Drawing Sheets

MULTI-CHANNEL LIGHT SOURCE AND MULTI-CHANNEL OPTICAL MODULE USING THE SAME

CLAIM OF PRIORITY

This application claims priority to an application entitled "MULTI-CHANNEL LIGHT SOURCE AND MULTI-CHANNEL OPTICAL MODULE USING THE SAME," filed in the Korean Intellectual Property Office on Nov. 15, 2003 and assigned Serial No. 2003-80883, the contents of which are hereby incorporated by reference.

BACKGROUND OF THE INVENTION

1. Field of the Invention

The present invention relates to a light source applicable to an optical communication system based on wavelength division multiplexing (WDM), and more particularly to a light source that can generate light of a wide wavelength band necessary for inducing a spectrum division and wavelength mode locking.

2. Description of the Related Art

A conventional optical communication system based on wavelength division multiplexing (WDM) is a communication system for transmitting and receiving a plurality of optical signals having different wavelengths. The conventional optical communication system communicates with subscribers according to a multiplexing and de-multiplexing operations upon the optical signals, such that communication capability can be easily extended and a high-speed optical communication system can be implemented.

The above-described WDM-based optical communication system multiplexes a plurality of downstream optical signals having different wavelengths to transmit data to the subscribers and outputs a result of the multiplexing. The optical communication system includes a central office (CO) for de-multiplexing the multiplexed downstream optical signals received from the subscribers according to the wavelengths, and a remote node (RN) arranged between each subscriber and the CO for carrying out a relay operation between each subscriber and the CO.

For the above-described WDM-based optical communication system, there have been proposed a plurality of light sources capable of generating optical signals having a single wavelength such as a distributed feedback (DFB) laser, etc., a light source based on spectrum division for dividing light of a wide wavelength band containing a plurality of channels having different wavelengths into a plurality of optical signals according to the wavelengths and using the optical signals according to a result of the division, a mode-locked light source for generating a mode-locked optical signal in response to each externally inputted channel, etc., as light sources for generating optical signals having the different wavelengths.

The spectrum division-based light source and the mode-locked light source described above must include a wideband light source for generating light of a wide wavelength band containing a plurality of channels having different wavelengths, and devices such as an optical waveguide grating or multiplexing filter, etc. for dividing the generated light according to the channels.

The above-described wavelength mode-locked light source is a light source for injecting a preset wavelength channel into a Fabry-Perot (FP) laser and generating an optical signal having the same wavelength as in the channel injected into the FP laser. That is, the above-described wavelength mode-locked light source must include a plurality of FP lasers for generating a mode-locked optical signal, respectively, and a wideband light source for generating wideband light containing a plurality of channels having different wavelengths to be injected into each FP laser.

The spectrum division-based light source uses channels based on the division operation generated from the wideband light source as optical signals, and the wavelength mode-locked light source uses channels generated from the wideband light source so that the FP laser can carry out a wavelength mode-locking operation.

The above-described wideband light source can use a light emitting diode (LED), a super-luminescent diode (SLD), a semiconductor optical amplifier, a microwave pulse light source or an Erbium-doped fiber (EDF) that can generate incoherent light having a wide wavelength band.

However, there are problems in that output power is low and disturbance due to noise, etc. is serious in the conventional wideband light sources. To address the above-described problems, a multi-wavelength light source in which amplification devices such as an EDF, etc. and an FP laser are coupled has been proposed.

There are problems, however, in that the FP laser and the amplification devices such as the EDF, etc. cannot be easily integrated and manufacturing cost increases. Moreover, serious power fluctuation in relation to light of the wide wavelength band according to wavelengths can occur, and the fluctuation phenomenon serves as a factor that can increase relative intensity noise.

SUMMARY OF THE INVENTION

The present invention has been made in view of the above problems, and it is an object of the present invention to provide a multi-channel light source that can reduce relative intensity noise and manufacturing cost.

In accordance with an aspect of the present invention, the above and other objects can be accomplished by the provision of a multi-channel light source that includes a semiconductor optical amplifier for generating light of a wide wavelength band and outputting the generated light through a first end and a second end. The light source further includes a Fabry-Perot (FP) resonator for resonating the light inputted from the semiconductor optical amplifier to generate an FP fringe and outputting the FP fringe to the semiconductor optical amplifier. The semiconductor optical amplifier amplifies the FP fringe inputted from the FP resonator and outputs the amplified FP fringe through the first end.

BRIEF DESCRIPTION OF THE DRAWINGS

The above and other objects, features and other advantages of the present invention will be more clearly understood from the following detailed description taken in conjunction with the accompanying drawings, in which the same or similar elements are denoted by the same reference numerals throughout the several views.

DETAILED DESCRIPTION

Hereinafter, embodiments of the present invention are described below in detail with reference to the annexed drawings. For the purposes of clarity and simplicity, details of known functions and configurations incorporated herein are omitted for clarity of presentation.

Figure 1:
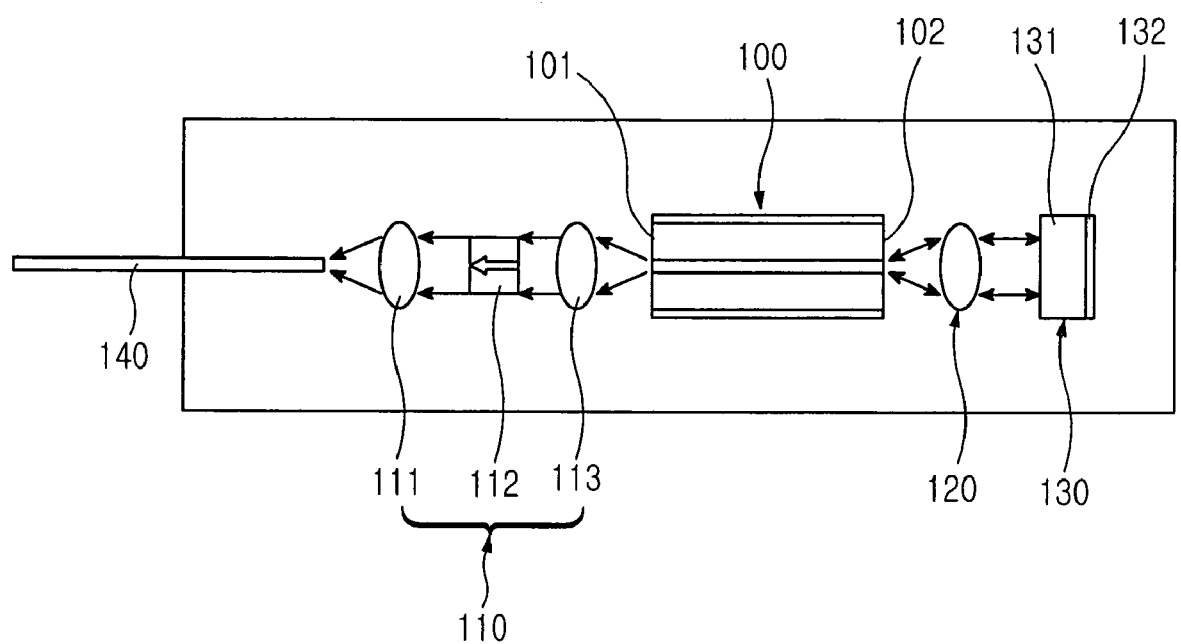
FIG. 1 is a schematic diagram illustrating the configuration of a multi-channel light source in accordance with a first embodiment of the present invention.

FIG. 1 is a schematic diagram illustrating the configuration of a multi-channel light source in accordance with a first embodiment of the present invention. Referring to FIG. 1, the multi-channel light source in accordance with the first embodiment of the present invention includes a semiconductor optical amplifier 100 for generating light of a wide wavelength band, a Fabry-Perot (FP) resonator 130 for resonating the generated light to an FP fringe and outputting the resonated light to the semiconductor optical amplifier 100, a first lens system 110, a second lens system 120, an optical fiber 140, etc. The FP fringe is a light band comprised of channels having different wavelengths.

The semiconductor optical amplifier 100 generates the wide wavelength band light, and outputs the generated light through first and second ends 101 and 102 thereof. Furthermore, the semiconductor optical amplifier 100 amplifies the FP fringe inputted from the FP resonator 130 and outputs the amplified FP fringe to the first end 101.

Figure 3:
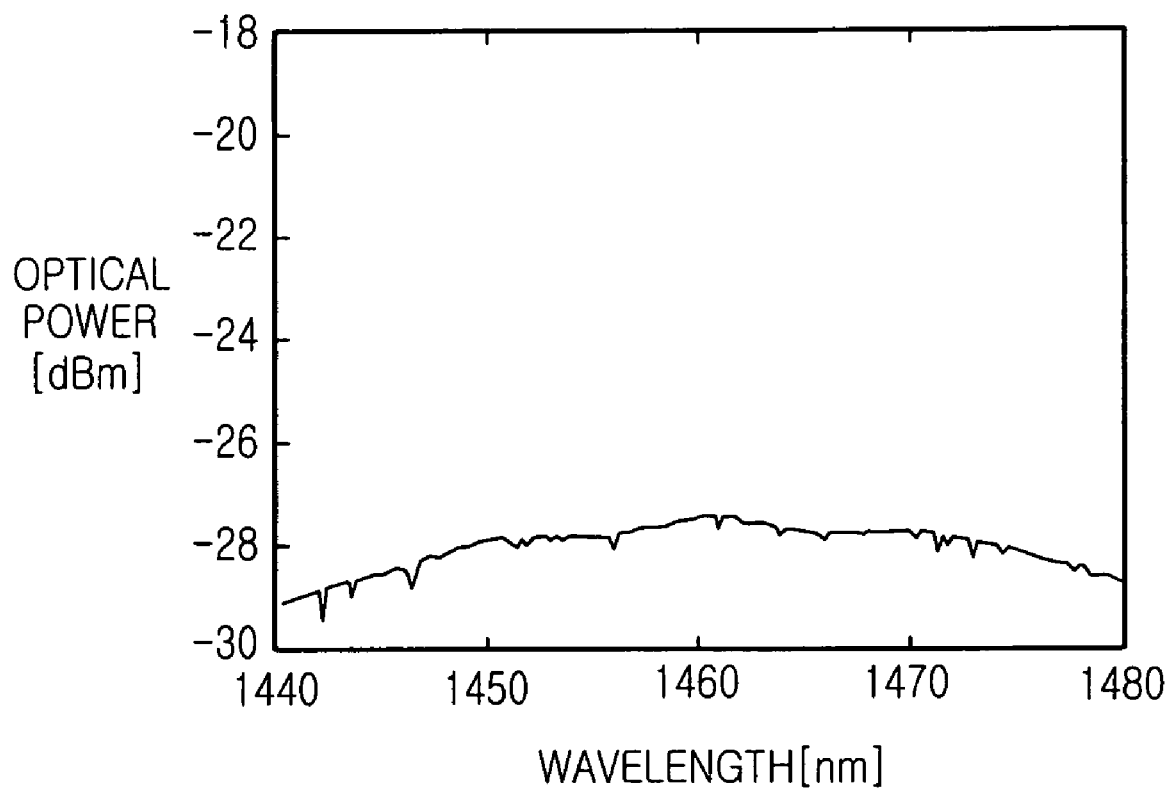
FIG. 3 is a graph illustrating a spectrum of light having a wide wavelength band generated from a semiconductor optical amplifier shown in FIG. 1.

FIG. 3 is a graph illustrating a spectrum of light having a wide wavelength band generated from a semiconductor optical amplifier shown in FIG. 1. Referring to FIG. 3, the light outputted from the semiconductor optical amplifier has a power range of −27~−29 dBm (where 1 dBm=0.1×log (power/1 milliwatt)) when being measured according to a resolution of 0.1 nm (nanometer or $10^{-9}$ meters) in a wavelength band range of 1440~1480 nm.

The first lens system 110 includes a first lens 111, a second lens 113 and an isolator 112 arranged between the first and second lenses 111, 113. The first lens system 110 converges the FP fringe amplified by the semiconductor optical amplifier 100 into an end of the optical fiber 140. The first lens system 110 reflects that part of the FP fringe that is not converged into the end of the optical fiber 140 and prevents the reflected part from entering the semiconductor optical amplifier 100.

In particular, the second lens 113 collimates the FP fringe outputted from the first end 101 of the semiconductor optical amplifier 100 and then outputs the collimated FP fringe to the isolator 112. The isolator 112 passes the FP fringe to the first lens 111, and prevents the partial FP fringe reflected by the first lens 111 from being transmitted to the second lens 113. The first lens 111 arranged between the optical fiber 140 and the isolator 112 converges the FP fringe inputted from the isolator 112 into one end of the optical fiber 140.

As the second lens system 120 is arranged between the semiconductor optical amplifier 100 and the FP resonator 130, it collimates light outputted from the semiconductor optical amplifier 100, inputs the collimated light into the FP resonator 130, and converges the FP fringe outputted from the FP resonator 130 into the semiconductor optical amplifier 100.

Figure 2:
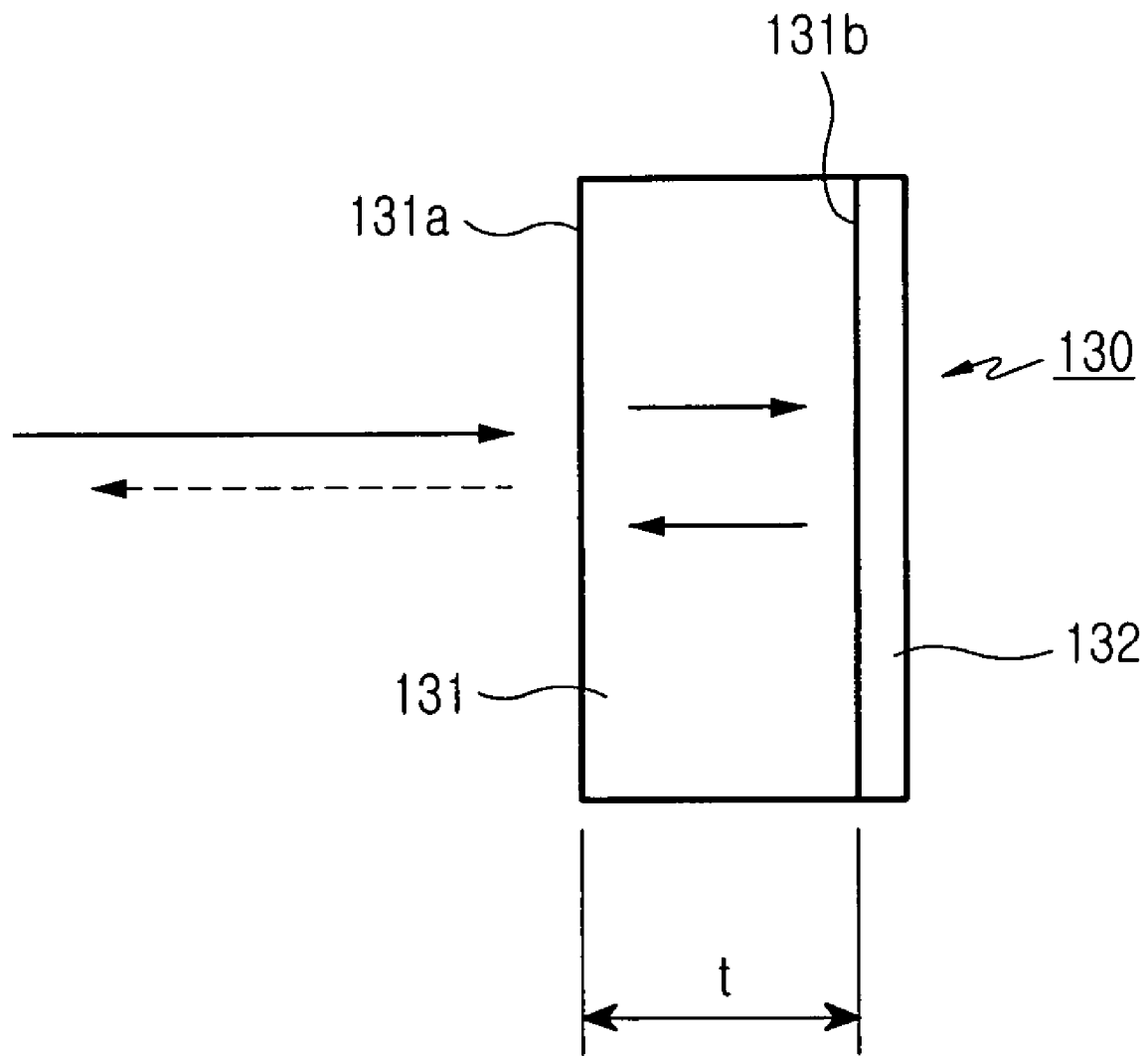
FIG. 2 is a schematic diagram illustrating a Fabry-Perot (FP) resonator shown in FIG. 1.

As shown in more detail in FIG. 2, the FP resonator 130 resonates the light inputted from the second lens system 120 to generate the FP fringe, which is then outputted to the semiconductor optical amplifier 100. The FP resonator 130 includes a resonant medium 131 and an external reflection layer 132.

The resonant medium 131 serves as a kind of an FP resonator for resonating light inputted thereto at both end surfaces because of a refractive index difference between air and the medium 131. The resonant medium 131 can employ a substance such as Indium Phosphide (InP), etc. having the characteristic of non-absorption of light. The reflectivity of one end surface 131a of the resonant medium 131 depends upon a wavelength of the light outputted from the semiconductor optical amplifier 100 and upon Fresnel reflection based on a refractive index of a medium through which the light between the second lens system 120 and the resonant medium 131 moves. Thickness of the resonant medium 131 depends upon an interval between channels contained in light of a desired wide wavelength band to be generated.

For example, the resonant medium 131 can employ a substance such as Indium Phosphide (InP), etc. having the reflectivity of 20%, where a wavelength of the light outputted from the semiconductor optical amplifier 100 is 1550 nm, and the medium between the resonant medium 131 and the second lens system 120 is air having a refractive index of 1.

Figure 4:
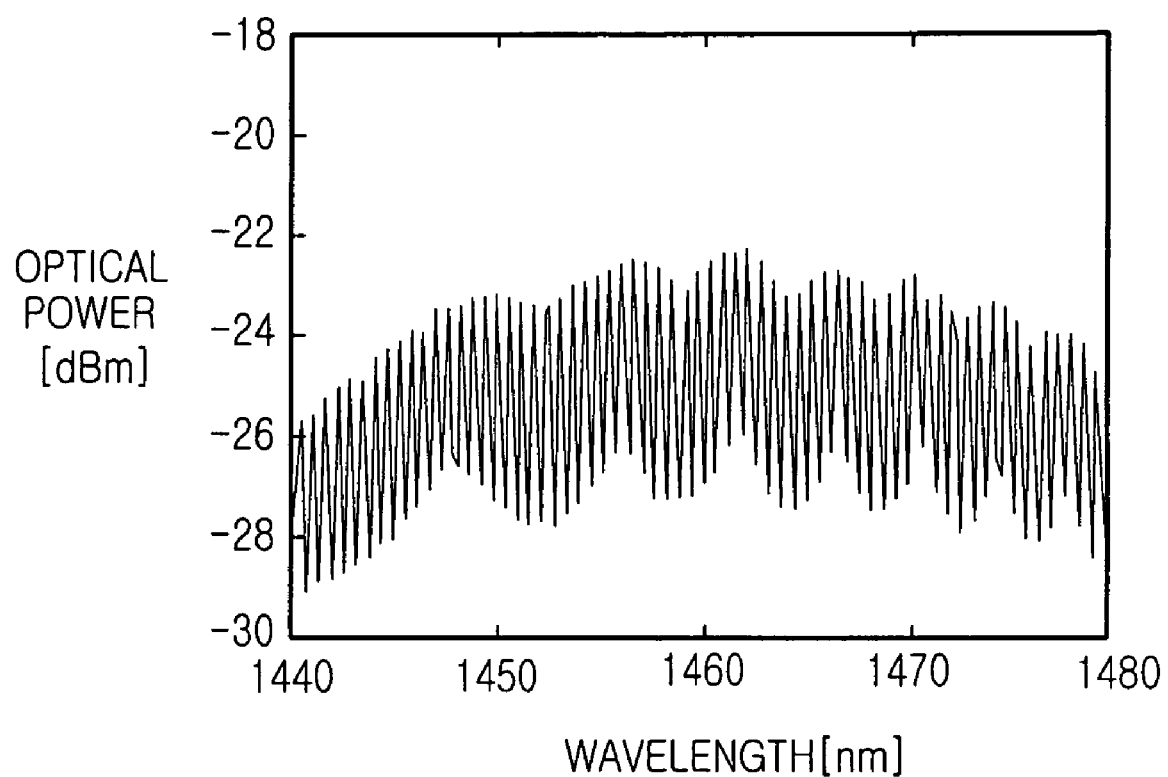
FIG. 4 is a graph illustrating a spectrum in the case where the semiconductor optical amplifier shown in FIG. 1 has amplified light resonated by the FP resonator without a reflection layer.

FIG. 4 is a graph illustrating a spectrum of an FP fringe amplified by the semiconductor optical amplifier 100 where the FP resonator 130 does not include an external reflection layer. Where the semiconductor optical amplifier 100 has amplified the FP fringe from the resonant medium 131 of the FP resonator 130, it can be found that the amplified FP fringe has a power range of −29~−23 dBm (when being measured in a resolution of 0.1 nm), and its amplitude is approximately 3~4 dB.

Figure 5:
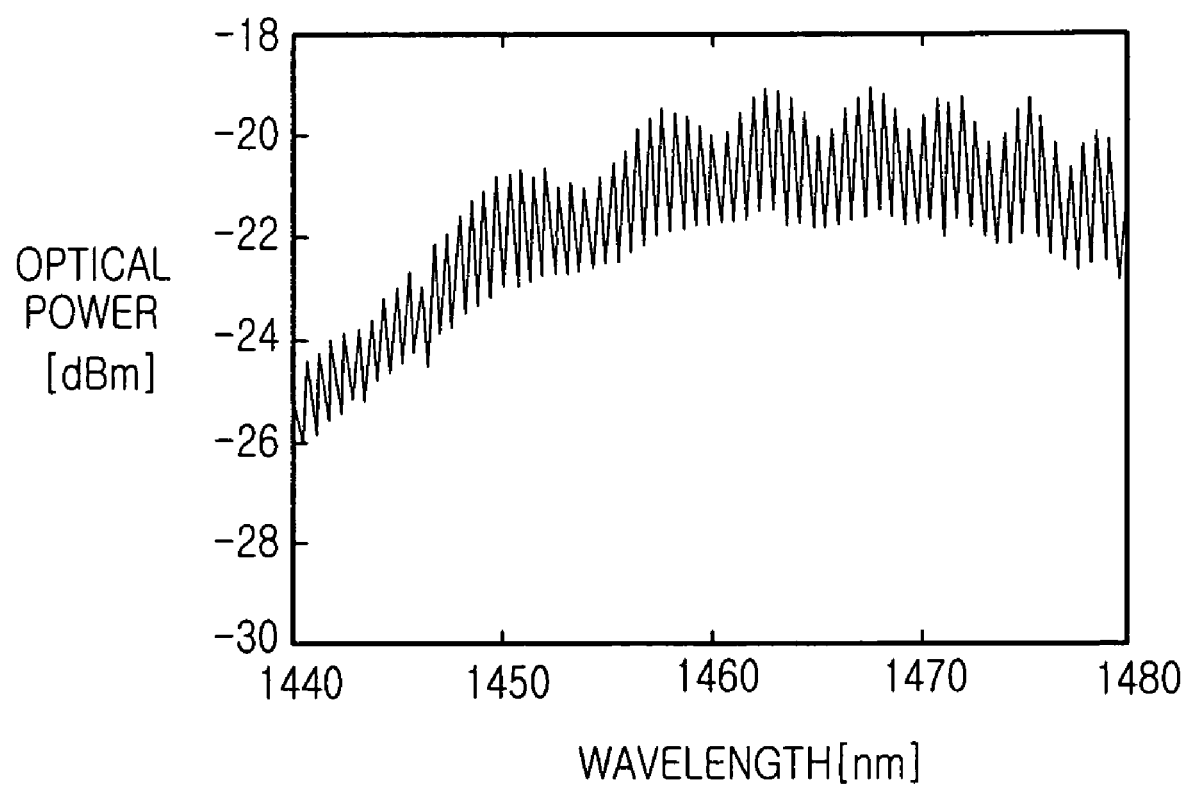
FIG. 5 is a graph illustrating a spectrum in the case where the semiconductor optical amplifier shown in FIG. 1 has amplified light resonated by the FP resonator with an external reflection layer.

As the external reflection layer 132 is coated on the other end surface 131b of the resonant medium 131, the reflectivity of the other end surface 131b can be adjusted. That is, the external reflection layer 132 reflects the FP fringe to the resonant medium 131 so that the light can be resonated between both the end surfaces 131a, 131b of the resonant medium 131. FIG. 5 shows a graph of a spectrum when the semiconductor optical amplifier 100 has amplified the FP fringe generated from the resonant medium 131 where the reflectivity of the other end surface 131b in the resonant medium 131 has been increased from 27% to 50%. Where the semiconductor optical amplifier 100 has amplified FP fringe components reflected by the external reflection layer 132, it can be found that the FP fringe has a power range of −26~−20 dBm (when being measured in a resolution of 0.1 nm).

As a result, the FP resonator 130 increases an intensity of the FP fringe inputted into the second end 102 of the semiconductor optical amplifier 100 when the reflectivity of the external reflection layer 132 is higher than the reflectivity (27% in case of InP) between air and the resonator. For this reason, power of the FP fringe amplified by the semiconductor optical amplifier 100 is increased. However, the higher reflectivity of the external reflection layer 132 causes an amplitude of the FP fringe to be reduced. The reflectivity of the external reflection layer 132 must not be excessively increased so that amplification efficiency of the channels contained in the FP fringe amplified by the semiconductor optical amplifier 100 can be maximized.

For example, as the reflectivity of the external reflection layer 132 is close to 100%, output power of the FP fringe outputted from the multi-channel light source increases. However, where the reflectivity of the external reflection layer 132 is 100%, resonant characteristics of the FP resonator 130 are not shown.

Figure 6:
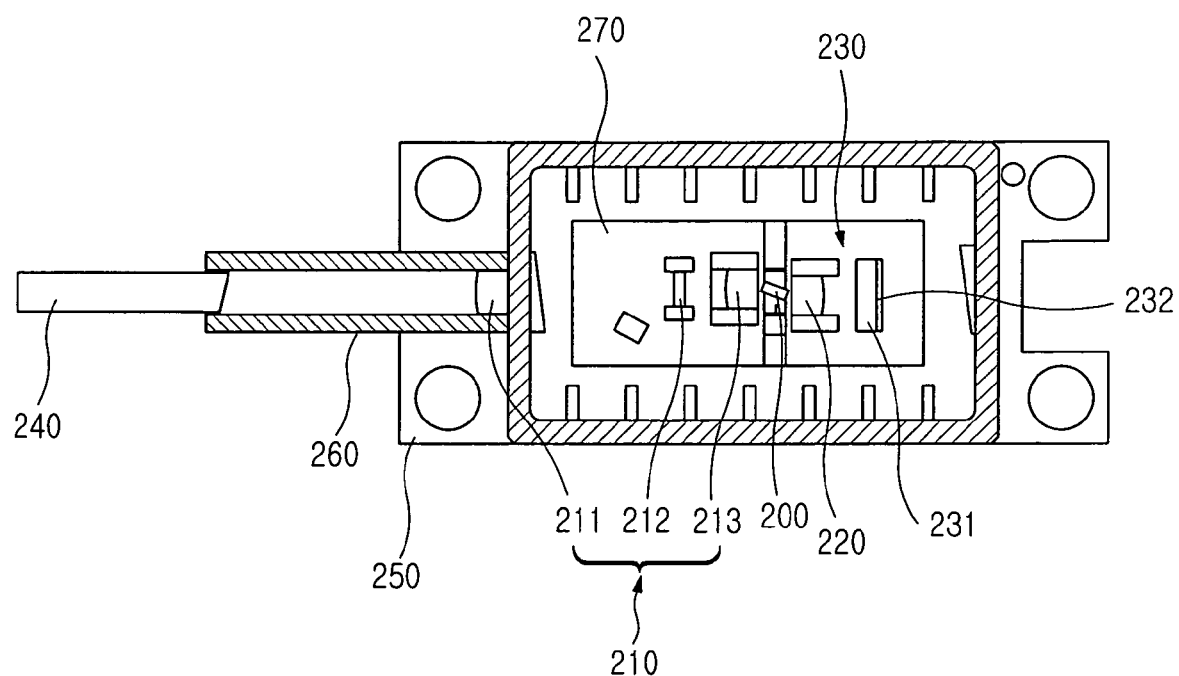
FIG. 6 is a schematic diagram illustrating the configuration of a multi-channel optical module in accordance with a second embodiment of the present invention.

FIG. 6 is a schematic diagram illustrating the configuration of a multi-channel optical module in accordance with a second embodiment of the present invention. The multi-channel optical module includes a housing 250 having a butterfly shape; a substrate 270 arranged on a base plane of the housing 250; a semiconductor optical amplifier 200 for generating light of a wide wavelength band, amplifying an internally inputted Fabry-Perot (FP) fringe, and outputting the amplified FP fringe; an FP resonator 230 for generating the FP fringe and inputting the generated FP fringe into the semiconductor optical amplifier 200; an optical fiber 240; and first and second lens systems 210, 220.

The substrate 270 is seated on the base plane within the housing 250 having the butterfly shape. A lens holder 260 supports one end of the housing 250 so that the optical fiber 240 can receive the FP fringe amplified by the semiconductor optical amplifier 200. The substrate 270 supports the semiconductor optical amplifier 200, the FP resonator 230, the first and second lens systems 210, 220, etc.

The optical fiber 240 is fixed to the one end of the housing 250 by the lens holder 260, and outputs the FP fringe amplified by the semiconductor optical amplifier 200 outside the multi-channel optical module.

The first lens system 210 includes a first lens 211, an isolator 212 and a second lens 213. As the first lens system 210 is arranged between the optical fiber 240 and the semiconductor optical amplifier 200, it converges the FP fringe amplified by the semiconductor optical amplifier 200 into the optical fiber 240 and prevents external light from entering into the semiconductor optical amplifier.

The first lens 211 is arranged between the optical fiber 240 and the isolator 212, and is fixed by the lens holder 260. The first lens 211 converges the FP fringe inputted from the isolator 212 into one end of the optical fiber 240.

The second lens 213 is arranged between the isolator 212 and the semiconductor optical amplifier 200 on the substrate 270. The second lens 213 collimates the FP fringe amplified by the semiconductor optical amplifier 200 and outputs the collimated FP fringe to the isolator 212.

The isolator 212 passes the FP fringe collimated by the second lens 213 to the first lens 211, and prevents light from the first lens 211 from entering into the second lens 213.

The semiconductor optical amplifier 200 internally generates light of a wide wavelength band and outputs the generated light to both ends thereof. In particular for example, the semiconductor optical amplifier 200 amplifies the FP fringe from the FP resonator 230 and outputs the amplified FP fringe back through the end facing the second lens system 220.

The FP resonator 230 resonates the light inputted from the semiconductor optical amplifier 200 to generate the FP fringe, and outputs the FP fringe to the semiconductor optical amplifier 200. The FP resonator 230 serves as a resonator for resonating inputted light, since the resonator includes a resonant medium 231 of preset thickness as a non-absorptive medium having higher reflectivity than the reflectivity of the medium through which light inputted from the second lens system 220 moves. Amplitude and output power of the FP fringe can be adjusted, because an external reflection layer 232 having preset reflectivity is formed at other end of the resonant medium 231.

The second lens system 220, arranged between the semiconductor optical amplifier 200 and the FP resonator 230, collimates light outputted from the semiconductor optical amplifier 200, inputs the collimated light into the FP resonator, and converges the FP fringe inputted from the FP resonator into the semiconductor optical amplifier.

As the FP fringe from the FP resonator is amplified by the semiconductor optical amplifier operating at a saturation region in accordance with the present invention, a multi-channel light source and a multi-channel optical module including the multi-channel light source experience relatively lower noise intensity, and can generate light with high amplification efficiency.

In accordance with the present invention, the FP resonator arranged at one side of a sub-mount oppositely to one end of the semiconductor optical amplifier resonates light of a wide wavelength band generated from the semiconductor optical amplifier to generate an FP fringe, and the semiconductor optical amplifier amplifies the FP fringe such that the multi-channel light source can provide multiple channels of higher power.

The FP resonator, as an added benefit, prevents a heating phenomenon, such as that experienced in a semiconductor laser for inducing an artificial resonance due to the injection of electric current, by using a refractive index difference between a medium through which light moves and the FP resonator. The multi-channel light source including the FP resonator can therefore, in effect, improve transmission characteristics and can prevent a change of a wavelength band of the optical signal due to the heating phenomenon of a high temperature.

Advantageously, the semiconductor optical amplifier and the FP resonator can be easily integrated and hence they can be easily applied to a small-sized product.

Although the preferred embodiments of the present invention have been disclosed for illustrative purposes, those skilled in the art will appreciate that various modifications, additions and substitutions are possible, without departing from the scope of the invention. Therefore, the present invention is not limited to the above-described embodiments and drawings.

What is claimed is:

1. A multi-channel light source, comprising:
a semiconductor optical amplifier for generating light of a wide wavelength band and outputting the generated light through a first end and a second end; and
a Fabry-Perot (FP) resonator for resonating the light inputted from the semiconductor optical amplifier to generate an FP fringe and outputting the FP fringe to the semiconductor optical amplifier,
wherein the semiconductor optical amplifier amplifies the FP fringe inputted from the FP resonator and outputs the amplified FP fringe through the first end,
wherein the FP resonator comprises a resonant medium having a first end surface receiving the light, and a second end surface coated with the external reflection layer so that the light resonates between the first and second end surfaces, the FP resonator containing Indium Phosphide (InP) for resonating the light without loss, and
wherein the generated FP fringe is contained in channels and an interval between said channels is adjustable by varying a thickness of the resonant medium.

2. The multi-channel light source as set forth in claim 1, wherein an intensity and an amplitude of the FP fringe inputted into the semiconductor optical amplifier are controlled by adjusting reflectivity of the external reflection layer.

3. The multi-channel light source as set forth in claim 1, further comprising:
a lens system arranged between the second end of the semiconductor optical amplifier and the FP resonator for collimating light outputted from the second end of the semiconductor optical amplifier, outputting the collimated light to the FP resonator, and converging the FP fringe from the FP resonator into the second end of the semiconductor optical amplifier.

4. The multi-channel light source as set forth in claim 1, further comprising:
an optical fiber for outputting the FP fringe outputted from the first end of the semiconductor optical amplifier outside the multi-channel light source; and
a first lens system arranged between the optical fiber and the first end of the semiconductor optical amplifier for converging the FP fringe outputted from the first end of the semiconductor optical amplifier into one end of the optical fiber.

5. The multi-channel light source as set forth in claim 4, wherein the first lens system comprises:
a first lens for collimating the FP fringe amplified by the semiconductor optical amplifier and outputting the collimated FP fringe;
a second lens for converging the collimated FP fringe into said one end of the optical fiber; and
an isolator arranged between the first lens and the second lens for inputting the FP fringe outputted from the first lens into the second lens and cutting off light inputted from the second lens.

6. A multi-channel optical module including a housing having a side, and a base plane in which a substrate is seated, comprising:
a semiconductor optical amplifier seated on the substrate, the amplifier having a first end and a second end, the amplifier for generating wideband light, outputting the generated light to both of the ends, amplifying a Fabry-Perot (FP) fringe inputted into the second end, and outputting the amplified FP fringe to the first end;
an FP resonator on the substrate oppositely to said second end, said resonator for resonating the light inputted from the semiconductor optical amplifier to generate the FP fringe, and outputting the FP fringe to said second end;
an optical fiber fixed at said side for outputting the FP fringe outputted from said first end outside the multi-channel optical module;
a first lens system arranged between the optical fiber and said first end; and
a second lens system arranged between said second end and the FP resonator for collimating the light outputted from the semiconductor optical amplifier, outputting the collimated light to the FP resonator, and converging the FP fringe outputted from the FP resonator into the semiconductor optical amplifier
wherein the FP resonator comprises a resonant medium having a forward end receiving the light and a rear end coated with the external reflection layer so that the light resonates between the forward and rear ends, the FP resonator containing Indium Phosphide (InP).

7. The multi-channel optical module as set forth in claim 6, wherein the first lens system comprises:
a first lens for converging the FP fringe amplified by the semiconductor optical amplifier into the optical fiber;
a second lens for collimating the FP fringe outputted from said first end of the semiconductor optical amplifier; and
an isolator arranged between the first lens and the second lens for passing the FP fringe collimated by the second lens to the first lens and preventing light from the first lens from being inputted into the second lens.

8. The multi-channel optical module as set forth in claim 6, wherein channels contain the FP fringe to be outputted by the FP resonator, and an interval between said channels is adjustable by varying a thickness of the resonant medium, the resonant medium containing a substance for resonating the light without loss.

9. The multi-channel optical module as set forth in claim 8, wherein an intensity and an amplitude of the FP fringe inputted into the semiconductor amplifier are controlled by adjusting reflectivity of the external reflection layer.

10. The multi-channel light source as set forth in claim 9, further comprising:
a second lens system arranged between the second end of the semiconductor optical amplifier and the FP resonator for collimating light outputted from the second end of the semiconductor optical amplifier, outputting the collimated light to the FP resonator, and converging the FP fringe from the FP resonator into the second end of the semiconductor optical amplifier.

11. The multi-channel light source as set forth in claim 6, further comprising:
a second lens system arranged between the second end of the semiconductor optical amplifier and the FP resonator for collimating light outputted from the second end of the semiconductor optical amplifier, outputting the collimated light to the FP resonator, and converging the FP fringe from the FP resonator into the second end of the semiconductor optical amplifier.

12. The multi-channel optical module as set forth in claim 6, wherein an intensity and an amplitude of the FP fringe inputted into the semiconductor amplifier are controlled by adjusting reflectivity of the external reflection layer.

13. The multi-channel optical module as set forth in claim 6, wherein an intensity and an amplitude of the FP fringe inputted into the semiconductor amplifier are controlled by adjusting reflectivity of the external reflection layer.

14. The multi-channel optical module as set forth in claim 11, wherein channels contain the FP fringe to be outputted by the FP resonator, and an interval between said channels is adjustable by varying a thickness of the resonant medium, the resonant medium containing a substance for resonating the light without loss.

15. The multi-channel optical module as set forth in claim 6, wherein channels contain the FP fringe to be outputted by the FP resonator, and an interval between said channels is adjustable by varying a thickness of the resonant medium, the resonant medium containing a substance for resonating the light without loss.

* * * * *

UNITED STATES PATENT AND TRADEMARK OFFICE
CERTIFICATE OF CORRECTION

| | |
|---|---|
| PATENT NO. | : 7,209,508 B2 |
| APPLICATION NO. | : 10/852519 |
| DATED | : April 24, 2007 |
| INVENTOR(S) | : Seung-Woo Kim et al. |

It is certified that error appears in the above-identified patent and that said Letters Patent is hereby corrected as shown below:

Title Page
Item [73], Assignee's city of residence, should read as follows:

--Gyeonggi-Do.--

Signed and Sealed this

Tenth Day of July, 2007

JON W. DUDAS
*Director of the United States Patent and Trademark Office*